US008925290B2

(12) United States Patent
Chang et al.

(10) Patent No.: US 8,925,290 B2
(45) Date of Patent: Jan. 6, 2015

(54) MASK STORAGE DEVICE FOR MASK HAZE PREVENTION AND METHODS THEREOF

(75) Inventors: Yung-Chih Chang, Zhutian Township (TW); Chih-Wing Chang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 343 days.

(21) Appl. No.: 13/228,175

(22) Filed: Sep. 8, 2011

(65) Prior Publication Data
US 2013/0062243 A1    Mar. 14, 2013

(51) Int. Cl.
B65B 55/00    (2006.01)
H01L 23/02    (2006.01)
B63C 11/00    (2006.01)
B65B 61/20    (2006.01)

(52) U.S. Cl.
CPC ............... B63C 11/00 (2013.01); H01L 23/02 (2013.01); B65B 55/00 (2013.01); B65B 61/20 (2013.01)
USPC .................................. 53/400; 53/467; 53/428

(58) Field of Classification Search
CPC ................... H01L 21/67359; H01L 21/67353; H01L 21/67386; H01L 21/67393; H01L 21/67769; G03F 1/66
USPC ................ 53/467, 428, 433, 111 R, 511, 400
See application file for complete search history.

(56) References Cited

U.S. PATENT DOCUMENTS

| | | | | |
|---|---|---|---|---|
| 5,843,196 A * | 12/1998 | Leavey et al. | | 55/356 |
| 6,000,198 A * | 12/1999 | Tramposch | | 53/432 |
| 6,216,873 B1 * | 4/2001 | Fosnight et al. | | 206/710 |
| 7,209,220 B2 * | 4/2007 | Puerto et al. | | 355/75 |
| 7,304,720 B2 * | 12/2007 | del Puerto et al. | | 355/75 |
| 7,400,383 B2 * | 7/2008 | Halbmaier et al. | | 355/72 |
| 7,420,655 B2 * | 9/2008 | Matsutori et al. | | 355/75 |
| 7,450,219 B2 * | 11/2008 | Matsutori et al. | | 355/75 |
| 7,463,338 B2 * | 12/2008 | Kurikawa | | 355/75 |
| 7,743,925 B1 * | 6/2010 | Lu et al. | | 206/710 |
| 7,942,269 B2 * | 5/2011 | Lu | | 206/586 |
| 7,975,848 B2 * | 7/2011 | Lin et al. | | 206/454 |
| 8,083,063 B2 * | 12/2011 | Lu et al. | | 206/454 |
| 8,146,623 B2 * | 4/2012 | Tieben et al. | | 141/63 |
| 8,220,630 B1 * | 7/2012 | Ku et al. | | 206/454 |
| 8,220,631 B2 * | 7/2012 | Lin et al. | | 206/454 |
| 8,235,212 B2 * | 8/2012 | Heerens | | 206/454 |
| 8,403,143 B2 * | 3/2013 | Chiu et al. | | 206/454 |
| 8,418,853 B2 * | 4/2013 | Ku et al. | | 206/710 |
| 8,480,348 B2 * | 7/2013 | Hyobu et al. | | 414/304 |
| 2002/0174627 A1 * | 11/2002 | Kitamura et al. | | 53/400 |
| 2002/0185409 A1 * | 12/2002 | Morrow | | 206/725 |
| 2003/0035713 A1 * | 2/2003 | Tsai et al. | | 414/800 |
| 2004/0074211 A1 * | 4/2004 | Shibata | | 53/440 |
| 2005/0006266 A1 * | 1/2005 | Kurikawa | | 206/455 |
| 2005/0236298 A1 * | 10/2005 | Schwenk et al. | | 206/710 |

(Continued)

Primary Examiner — Stephen F Gerrity
Assistant Examiner — Eyamindae Jallow
(74) Attorney, Agent, or Firm — Lowe Hauptman & Ham, LLP

(57) ABSTRACT

A mask storage device and a method of preventing defect formation on a mask are provided. The method includes providing a mask storage device comprising a first and second shell configured to form a sealed space in a closed state and a desiccant positioned within the mask storage device. The method further includes placing a mask inside the mask storage device and sealing the mask storage device with the mask and desiccant inside the sealed space.

19 Claims, 12 Drawing Sheets

(56) References Cited

U.S. PATENT DOCUMENTS

| | | | |
|---|---|---|---|
| 2006/0109449 A1* | 5/2006 | Matsutori et al. | 355/75 |
| 2006/0201958 A1* | 9/2006 | Tieben et al. | 220/835 |
| 2006/0237338 A1* | 10/2006 | Nakamae | 206/316.1 |
| 2006/0266011 A1* | 11/2006 | Halbmaier et al. | 55/385.6 |
| 2009/0026279 A1* | 1/2009 | Dittmer et al. | 236/44 R |
| 2010/0126905 A1* | 5/2010 | Lin | 206/710 |
| 2010/0140126 A1* | 6/2010 | Lu et al. | 206/454 |
| 2011/0155598 A1* | 6/2011 | Lu et al. | 206/349 |
| 2012/0235970 A1* | 9/2012 | Lavery et al. | 345/211 |

* cited by examiner

MASK STORAGE DEVICE FOR MASK HAZE PREVENTION AND METHODS THEREOF

BACKGROUND

The disclosure relates generally to the prevention of damage to masks used in semiconductor manufacturing and, more particularly, to prevention of haze formation on mask surfaces.

Semiconductor manufacturing processes require the creation and maintenance of masks that are substantially free of scratches, particle deposition, and pellicle frames so that each mask is in condition for use in lithography. The presence of defects results in reduced silicon wafer yield during lithography. As such, attention to the prevention and discovery of mask defects is required to prevent yield loss of silicon wafers.

Some mask defects are formed after the lithography process. During the mask making process, masks are rinsed with various compositions, including a composition containing ammonium ions. Residual ammonium ions left on the mask surface react with residual sulfuric acid or sulfate ions from the strip process in a high energy environment. As such, ammonium sulfate [$(NH_4)_2SO_4$] may form on the mask surface in the presence of water [$H_2O$] under one of the following chemical reactions:

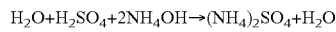

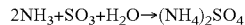

Under these conditions, an ammonium sulfate [$(NH_4)_2SO_4$] haze forms on the mask surface, which impacts the usage life of the mask as well as the yield of silicon wafers.

Current measures known to the inventors for reducing the formation of an ammonium sulfate [$(NH_4)_2SO_4$] haze on the mask surface include the use of storage cabinets which circulate clean dry air and purge the cabinet with nitrogen. Such cabinets are expensive to obtain and require monitoring.

DESCRIPTION OF THE DRAWINGS

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure. The features, aspects, and advantages of the present disclosure will become more fully apparent from the following detailed description, appended claims, and accompanying drawings in which:

DETAILED DESCRIPTION

Figure 1:
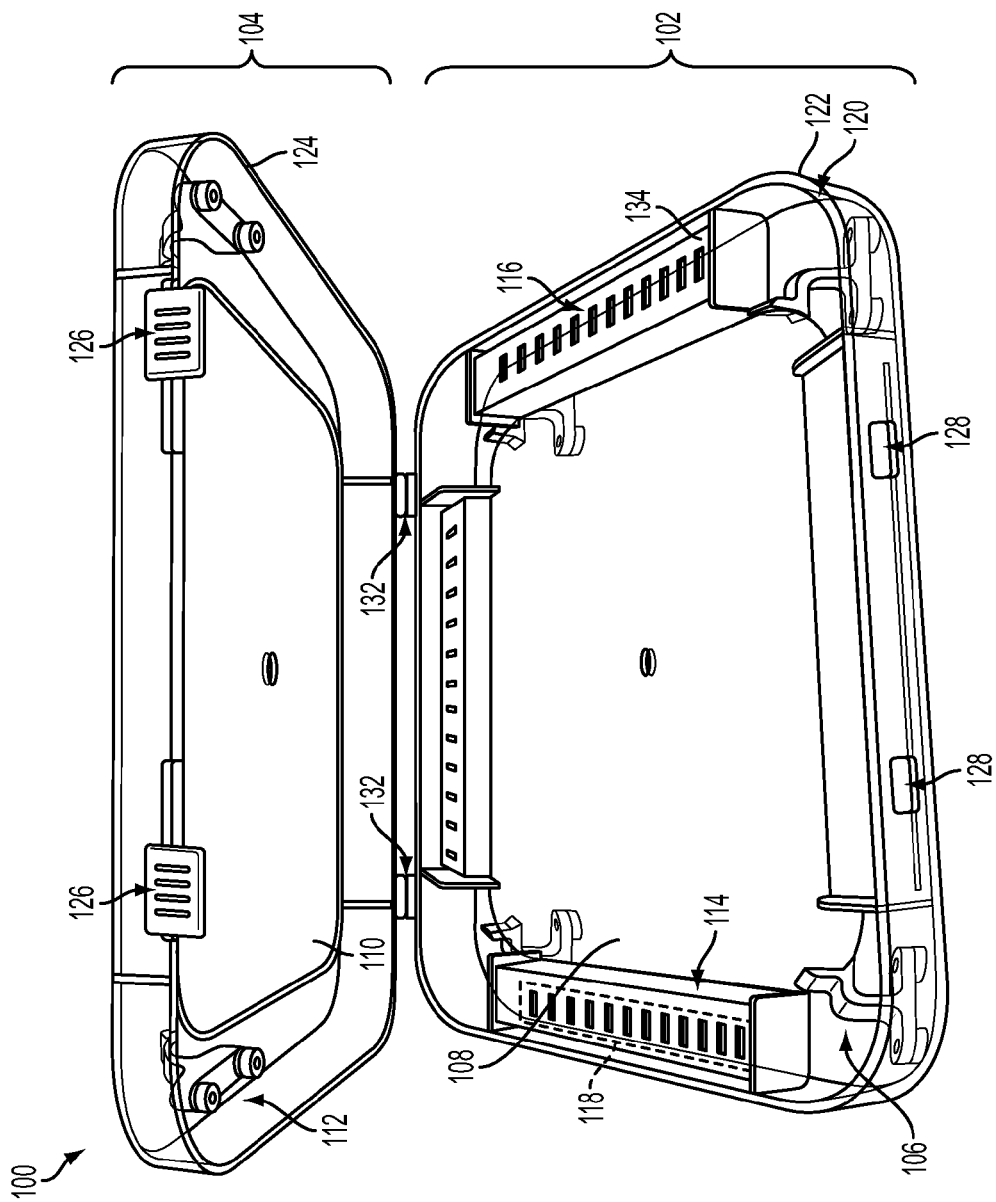
FIG. 1 is an elevated front view of a mask storage device in accordance with an embodiment.

It is understood that the following disclosure provides many different embodiments, or examples, for implementing different features of the disclosure. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In the following description, numerous specific details are set forth to provide a thorough understanding of the present disclosure. However, one having ordinary skill in the art will recognize that the embodiments can be practiced without these specific details. In some instances, well-known structures and processes have not been described in detail to avoid unnecessarily obscuring the present disclosed embodiments.

One or more embodiments of a method of and device for storing masks used in the semiconductor wafer manufacturing process are useful in preventing defect formation on a mask surface.

Figure 2:
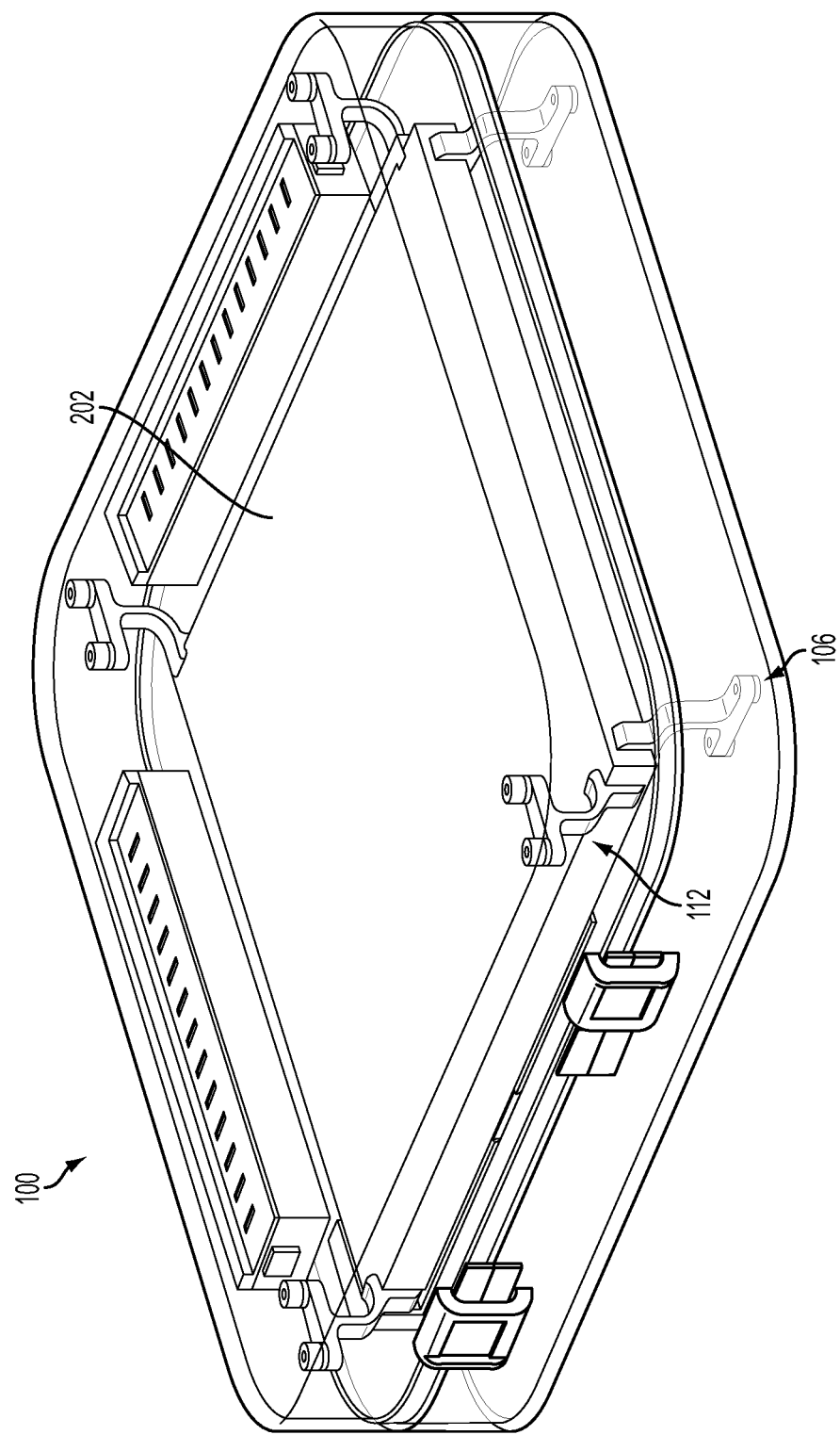
FIG. 2 is a view of the mask storage device in a closed state in accordance with an embodiment.

FIG. 1 is a front view of a mask storage device 100 having a lower shell 102 and an upper shell 104 in an open state and arranged to receive and retain therein a mask 202 (FIG. 2). Upper shell 104 and lower shell 102 are generally rectangular parallelepipeds having an open face. In some alternative embodiments, upper shell 104 and lower shell 102 are other shapes and sizes. In some alternative embodiments, upper shell 104 and/or lower shell 102 are multi-piece designs. Lower shell 102 and upper shell 104 comprise acrylonitrile butadiene styrene (ABS). In at least some embodiments, ABS is selected for impact resistance and/or electroinsulating properties. In other embodiments, lower shell 102 and upper shell 104 are constructed of anti-electrostatic discharge materials having low outgas and low particle discharge properties to prevent discharge of chemical contaminants that may create defects, such as haze, on a mask surface, including thermoplastics. In still further embodiments, the upper and lower shells 104 and 102, respectively, are constructed of different materials as to each other. With reference to FIG. 1, the materials are translucent. In some other embodiments, the materials are transparent or opaque.

Lower shell 102 has an inner surface 108. Mask receiving brackets 106 are molded to the inner surface 108 of the lower shell 102 for receiving mask 202 (FIG. 2). Each mask receiving bracket 106 has at least one surface for contacting and retaining the mask in place between the multiple mask receiving brackets 106 to prevent movement of the mask when placed inside the mask storage device 100. The mask receiving bracket 106 is molded as part of the lower shell 102. In other embodiments, mask receiving bracket 106 is bonded to the inner surface 108. In other embodiments, the mask receiving bracket 106 is fastened to the inner surface 108 in a removable fashion.

A set of four (4) mask receiving brackets 108 is mounted to the inner surface 108. In other embodiments, a single bracket or platform for receiving the mask substitutes for the plurality of mask receiving brackets 106. In other embodiments, a greater or lesser number of mounting brackets are used.

The upper shell 104 has an inner surface 110. Retention brackets 112 are attached to surface 110 similarly, as described above, with regard to attachment of brackets 106 to surface 108. A plurality of retention brackets 112 are attached to the inner surface 110. In at least some embodiments, inner surface 110 does not have retention brackets 112. In at least some embodiments, a single platform or bracket is attached to the surface 110. In some embodiments, upper shell 104 is a copy of lower shell 102.

Affixed to the lower shell 102 is at least one retainer for holding a desiccant or desiccant packet therein, e.g., a humidity reducing material or other component. Each desiccant container 114 is a retainer that is affixed to the lower shell 102 along the perimeter of the lower shell that holds desiccant therein. In other embodiments, desiccant containers 114 are affixed to the upper shell. In some embodiments, desiccant containers are affixed to both the upper and lower shells 104 and 102, respectively.

Desiccant container 114 is a rectangular box with one or more air vents 116. In some other embodiments, the desiccant container 114 has a single air vent. In some embodiments, the desiccant container 114 has one or more membranes which are permeable to allow air to penetrate through the membranes into the desiccant container 114.

A set of four (4) desiccant containers 114 is removably attached to the lower shell 102. In at least some other embodiments, a single desiccant container 114 is affixed to the storage device 100. In some other embodiments, a greater or lesser number of desiccant containers 114 are used. In at least some other embodiments, the set of desiccant containers 114 is removably or fixedly attached to the upper shell 104 and/or the lower shell 102.

Figure 8:
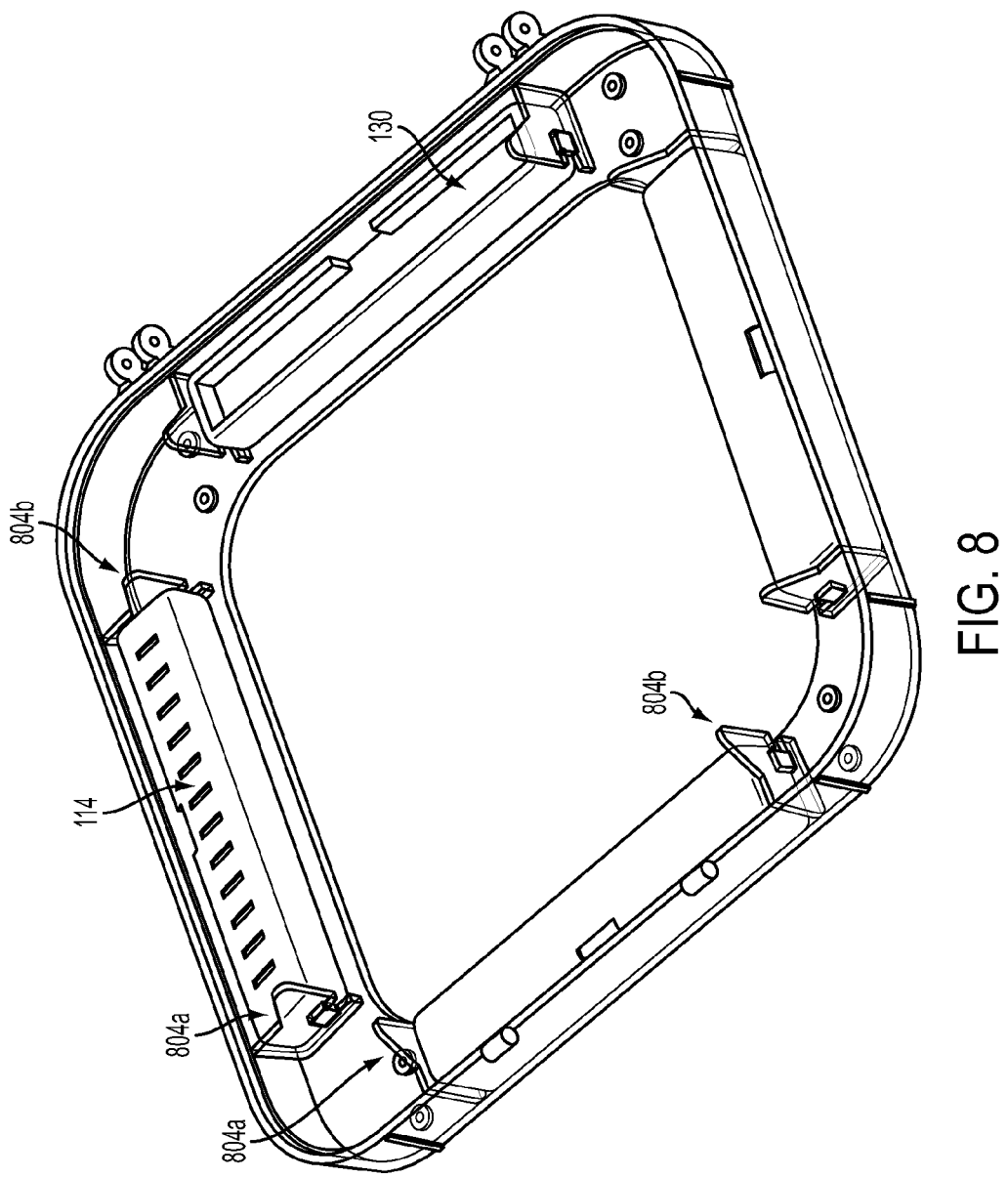
FIG. 8 is a view of the lower shell with the upper shell removed for clarity in accordance with an embodiment.

Each desiccant container 114 is a parallelepiped having a removable lid 134 generally defining an upper surface of the desiccant container. The lid 134 is removable. When removed, the inner surfaces of the desiccant container define an inner space 130 (FIG. 8). A desiccant or desiccant packet 118 (broken line) is placed within space 130 and the lid is secured to the desiccant container 114 to secure the desiccant therein. As such, the desiccant container 114 retains a desiccant therein for reducing humidity level in the space 130. Types of desiccant include clay, calcium oxide, silica gel and a molecular sieve, or any other suitable desiccants to remove humidity from an air supply. The lid 134 has a plurality of air vents 116 located therein to allow the flow of air within the mask storage device 100 to contact the desiccant. In other embodiments, other surfaces of the desiccant container 114 comprise the air vent or air vents.

In some other embodiments, desiccant container 114 is an integrated structure formed as part of lower shell 102. In some other embodiments, desiccant container 114 is an integrated structure formed as part of upper shell 104. In some other embodiments of the mask storage device 100, the retainer is a clamp formed as part of the lower shell. The clamp is a clip that retains a desiccant packet. In some other embodiments, the clamp is a flexible member sized to retain the desiccant packet.

Lower shell 102 has a lower shell mating surface 120 along the outer perimeter of the lower shell 102. A gasket 122 is positioned along the lower shell mating surface 120.

In one embodiment, the gasket 122 is an anti-electrostatic, low outgas block glue, including but not limited to ABS.

The upper shell 104 has an upper shell mating surface 124 that contacts the gasket 122 when the mask storage device 100 is in a closed state, thereby sealing the mask 202 (FIG. 2) within the mask storage device.

In at least some embodiments, lower shell 102 and upper shell 104 are connected via a pair of hinges 132. In other embodiments, the lower shell 102 and upper shell 104 are connected by a single hinge 132 or more than two hinges. Hinge 132 allows pivoting of the upper shell 104 with respect to the lower shell 102, thereby alternating the mask storage device 100 between open and closed states. In some embodiments, hinge 132 is replaced by one or more latch mechanism, such as one similar to the latch mechanism 126 and 128, so that the upper shell 104 and lower shell 102 are removed from each other and reattached by contacting the lower shell mating surface 120 and/or upper shell mating surface 124 to the gasket 122, and secured in the closed state by latch mechanisms 126 and 128.

Mask storage device 100 also has a latch mechanism 126 and 128 on corresponding outer surfaces of upper shell 104 and lower shell 102 to secure the mask storage device in a closed state.

In some embodiments, the mask storage device includes at least an upper shell 104 and a lower shell 102, where the lower shell defines a storage space for masks, and the upper shell is a door for accessing the storage space. In some embodiments, the mask storage device 100 includes two or more shells that define an airtight sealed storage space.

FIG. 2 is a view of mask storage device 100 (broken line) in a closed state and containing mask 202 within the mask storage device. Mask 202 is supported within the mask storage device 100 between the retention brackets 112 and receiving brackets 106. In one embodiment, a single mask 202 is placed and secured within the mask storage device 100. In other embodiments, multiple masks are placed and secured within the mask storage device 100. In some embodiments, multiple masks stored within the mask storage device 100 are separated from each other by a spacer.

Figure 3:
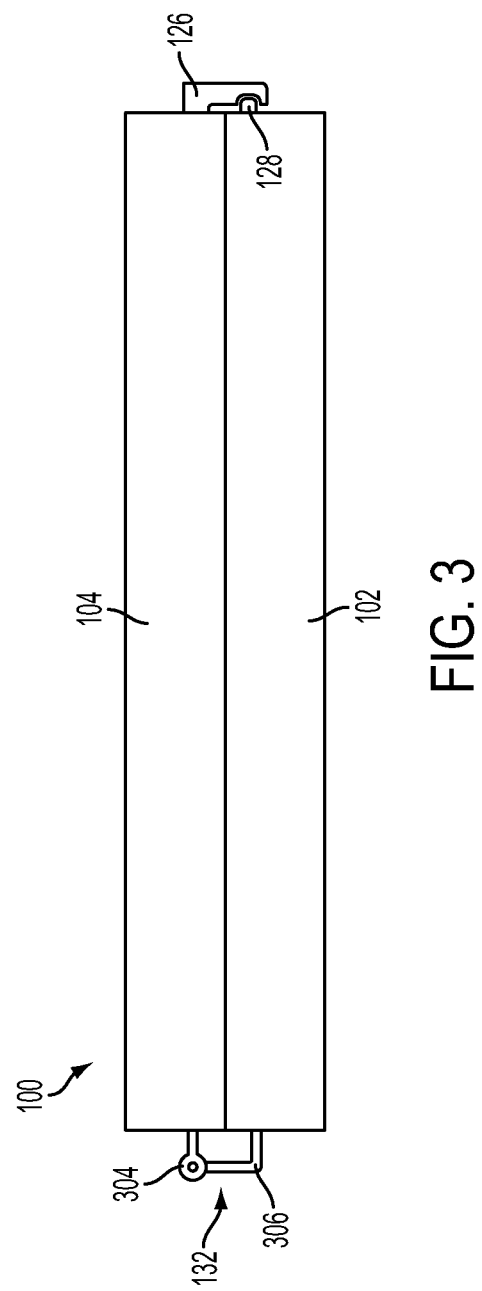
FIG. 3 is a side view of the closed mask storage device of FIG. 2 in accordance with an embodiment.

FIG. 3 is a side view of the closed mask storage device 100 of FIG. 2. The lower shell 102 and upper shell 104 are secured in closed position by the latch mechanism 126 and 128 to reinforce the closed position. In other embodiments, a clamp is affixed around the mask storage device 100 to reinforce the mask storage device 100 in a closed state. Types of clamps include C-clamps, elastomeric bands, or other suitable closure mechanisms. Some embodiments include both the latch mechanism and the clamp.

In at least some embodiments, hinge 132 comprises a first member 304 and second member 306. First member 304 is integrally formed as part of upper shell 104. Second member 306 is integrally formed as part of lower shell 102. In some other embodiments, hinge 132 is formed separately from upper shell 104 and lower shell 102 and thereafter affixed to the mask storage device 100.

Figure 4:
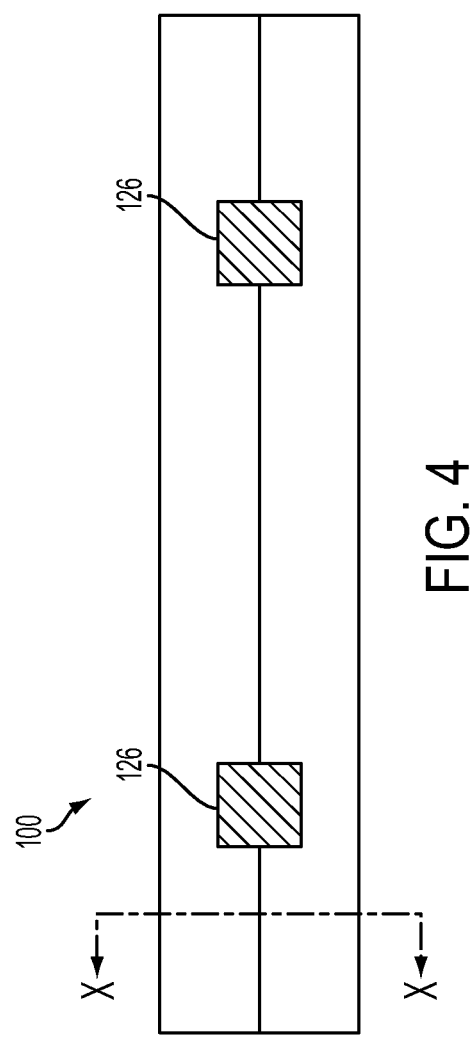
FIG. 4 is a front view of the mask storage device of FIG. 2 in accordance with an embodiment.

FIG. 4 is a front view of the mask storage device 100 of FIG. 2.

Figure 5:
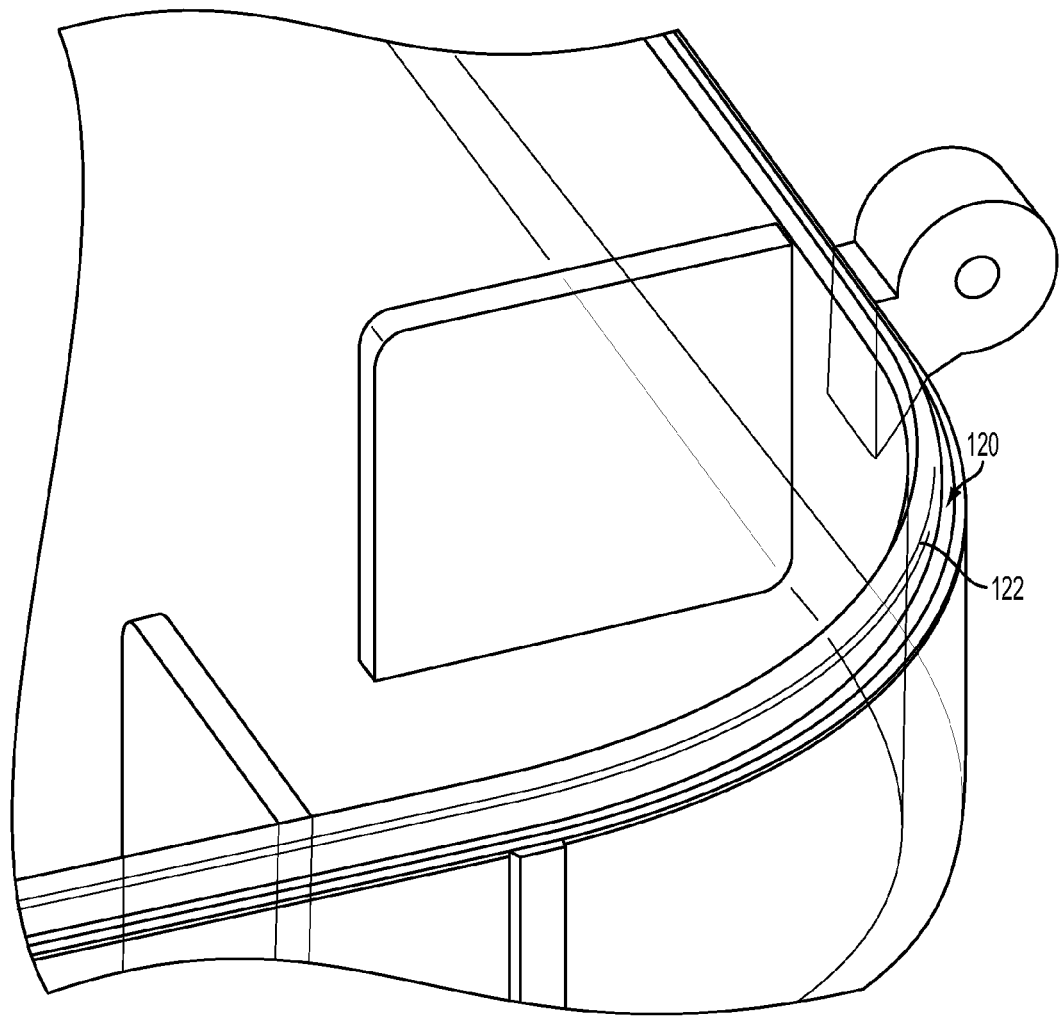
FIG. 5 is an expanded view of a corner of the lower shell of the mask storage device of FIG. 2 in accordance with an embodiment.

FIG. 5 is an expanded view of a corner of the lower shell of FIG. 2. Gasket 122 is affixed to the lower shell mating surface 120 by curing the gasket 122 onto the mating surface 120. In at least some other embodiments, gasket 122 is lacquered onto the mating surface. In at least some other embodiments, the gasket 122 is formed independently of the mask storage device and is removably secured to the mating surface 120, Gasket 122 forms an airtight seal between the mating surfaces 120 and 124 to prevent the flow of air into the mask storage device 100. In some embodiments, gasket 122 is compressible.

Figure 6:
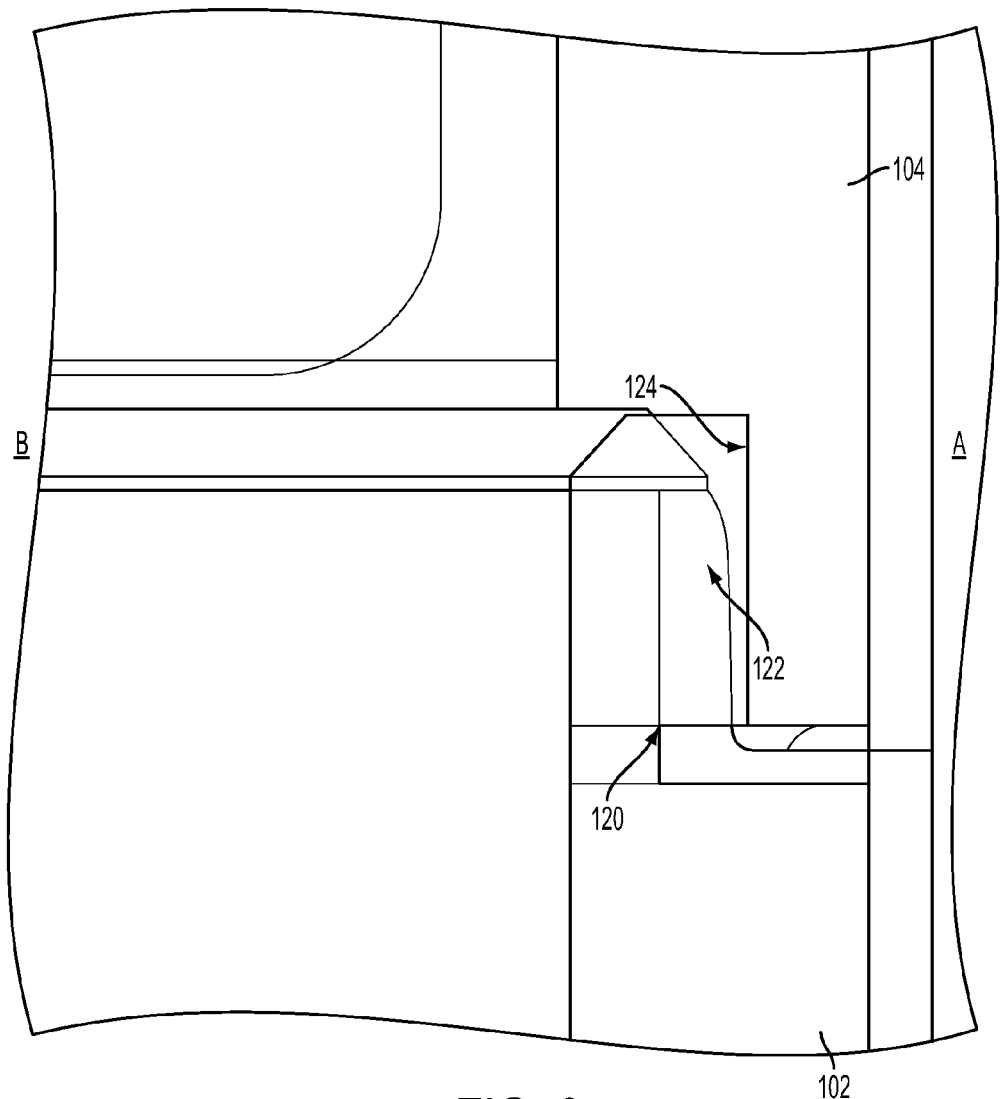
FIG. 6 is an expanded cross-sectional view of the mask storage device in a closed state along line X-X in FIG. 4 in accordance with an embodiment.

FIG. 6 is an expanded cross-sectional view of the mask storage device 100 in a closed state along line X-X in FIG. 4. The upper shell mating surface 124 and lower shell mating surface 120 are formed to match each other when the mask storage device 100 is in a closed state. In a closed state, upper shell mating surface 124 contacts the gasket 122. As such, an airtight seal is sufficiently formed between the lower shell 102 and upper shell 104 to prevent circulation of air from space A (outside the mask storage device) and into space B (inside the mask storage device). In some other embodiments, upper shell mating surface 124 and lower shell mating surface 120 are formed to define a gap for retaining the gasket 122 when the mask storage device 100 is in a closed state yet still form a seal with the gasket 122.

Figure 7:
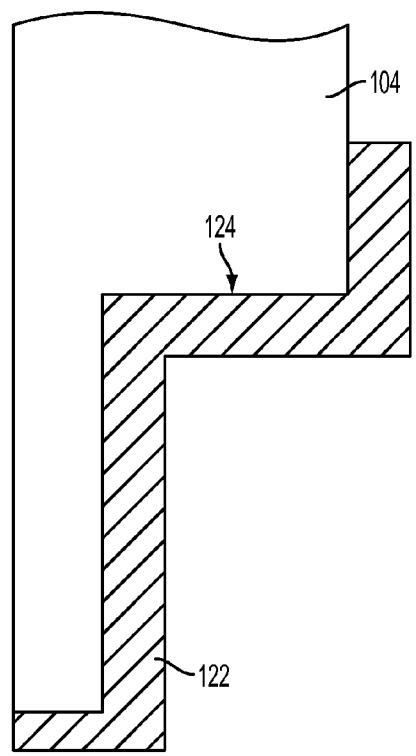
FIG. 7 is an expanded cross-sectional view of an alternative embodiment of a gasket in accordance with an embodiment.

FIG. 7 is an expanded cross-sectional view of an alternative embodiment of the interaction of the gasket 122 and upper shell 104, wherein the gasket 122 is applied directly to the upper shell mating surface 124. In a differing embodiment, the gasket 122 may be applied to either the lower shell mating surface 120 or the upper shell mating surface 124. In some other embodiments, separate gaskets are applied separately to both the lower shell mating surface 120 and the upper shell mating surface 124 and an air tight seal is sufficiently formed as the gaskets contact each other. In other embodiments, the gasket 122 is an O-ring, or other sealing or compressible member, that contacts the lower shell 102 and upper shell 104 to sufficiently create an airtight seal.

Figure 9:
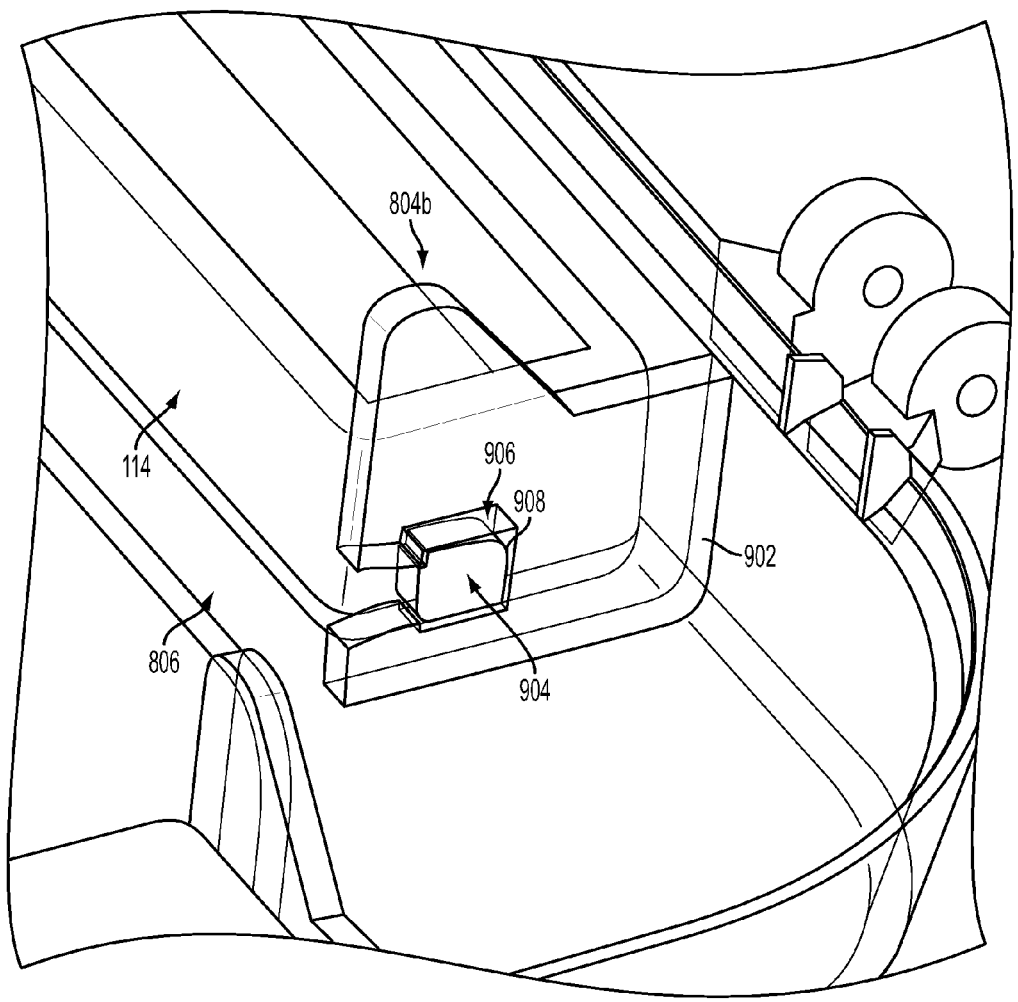
FIG. 9 is an expanded view of the desiccant container in accordance with an embodiment.

FIG. 8 is a view of the lower shell 102 with the upper shell 104 removed for clarity. Each desiccant container 114 has a pair of ends 806 that are substantially identical. Each end 806 has an end surface 906 that has an elongated stud 904 molded (FIG. 9). Each desiccant container 114 is mounted between a pair of desiccant supports 804a and 804b.

Desiccant supports 804a and 804b are flanges molded as part of the inner surface 108 of lower shell 102. Desiccant supports 804a and 804b are substantially mirror images of each other. In other embodiments, desiccant supports 804a and 804b are mounted or affixed to the lower shell 102. In some other embodiments, desiccant supports 804a and 804b are bonded to the inner surface 108. In some other embodiments, desiccant supports 804a and 804b are removably attached to inner surface 108.

FIG. 9 is an expanded view of one end 806 of the desiccant container 114 and desiccant support 804b. Desiccant support 804a has an inner surface 908 defining a detent 906 therein. Stud 904 is configured to be fitted within the detent 906. As such, placement of the stud 904 in the detent 906 secures the one end 906 of the desiccant container 114 to a desiccant support 804b. Placement of the stud 904 on each end 806 into the through hole 906 of desiccant supports 804a and 804b secured the desiccant container to the lower shell 102.

Figure 10:
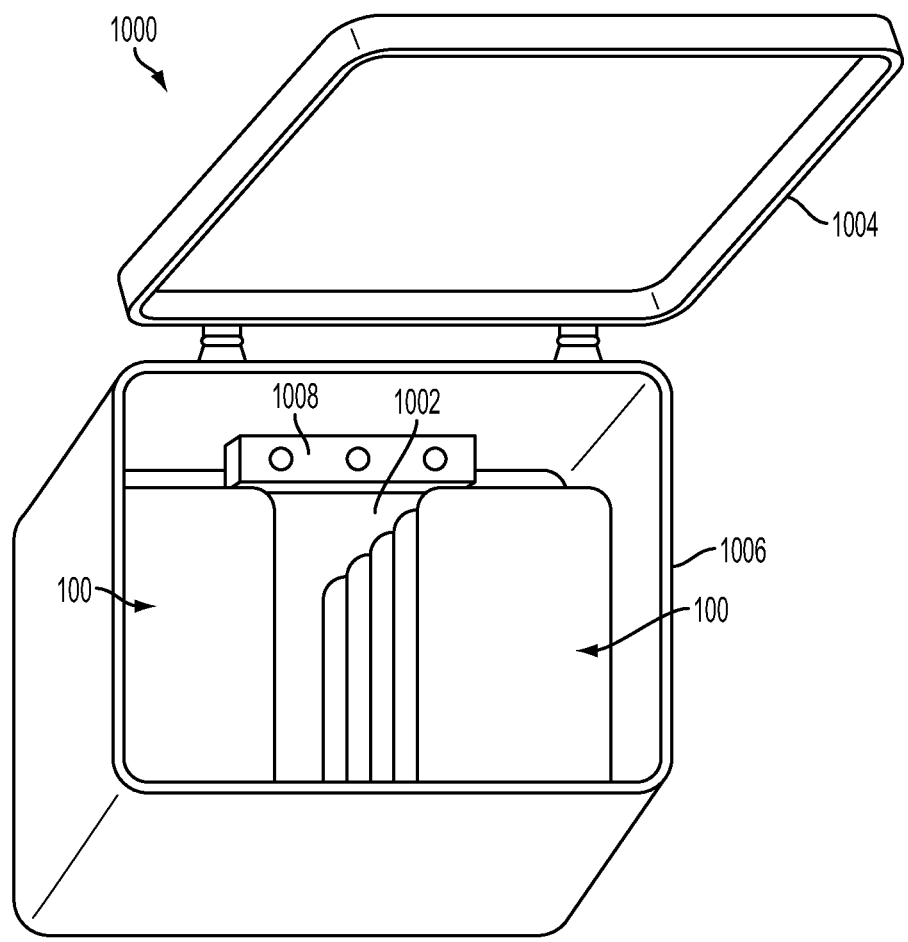
FIG. 10 is a view of a mask storage container in accordance with an embodiment.

FIG. 10 is a view of a plurality of mask storage devices 100 stacked within a mask storage container 1000 in an open state. Mask storage container 1000 has an inner volume 1002 to allow placement of mask storage devices 100 therein. Mask storage container 1000 has mateable surfaces 1004 and 1006 that contact to create an airtight seal when the mask storage container 1000 is in a closed state. Mask storage container 1000 is made of ABS. In other embodiments, mask storage container is made of anti-electrostatic discharge materials having low outgas and low particle discharge properties, including some thermoplastics. Mask storage container 1000 has at least one desiccant container 1008 secured therein similarly to how desiccant containers 114 are secured to mask storage device 100.

In at least some embodiments, the components described herein are constructed of ABS, or other material having anti-electrostatic discharge properties having low outgas and low particle discharge properties to prevent the discharge of chemical contaminants that may create defects on a mask surface. Further, the presence of a desiccant within the device or container creates a low humidity environment that prevents the formation of ammonium sulfate $[(NH_4)_2SO_4]$ haze on a mask surface. In this regard, the inventors have found that storage of masks in mask storage devices 100 and/or containers 1100 as described herein have increased the effective lifetime of masks used in the silicon manufacturing process by three times. In other embodiments, the mask storage device 100 is stored in a humidity controlled room. A system for controlling the room's environment, such as ambient humidity, is connected to the room. Further, the room is constructed of low outgas and low particle discharge materials.

Figure 11:
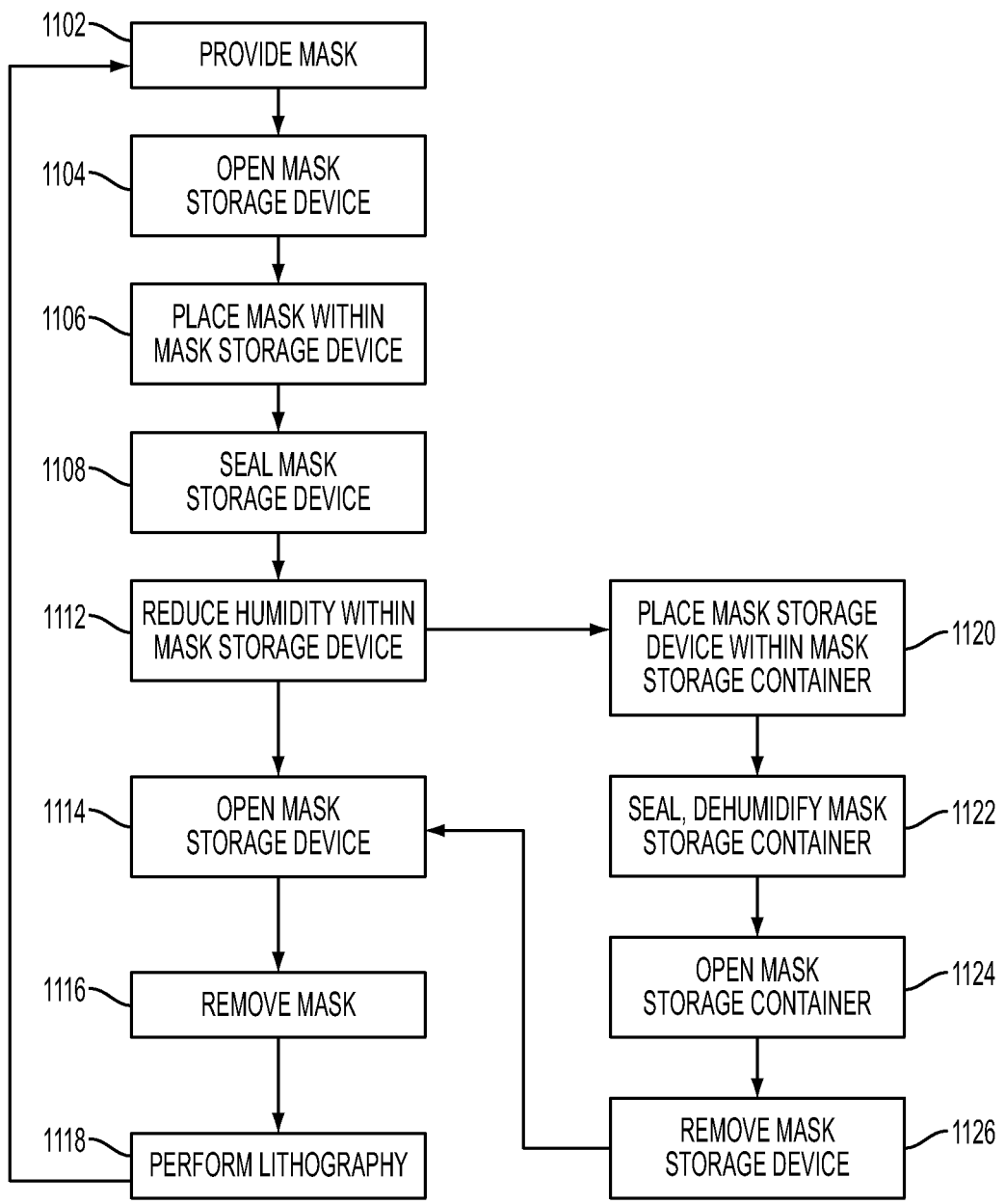
FIG. 11 is a flow chart of a method of use of the mask storage device in accordance with an embodiment.

FIG. 11 is a flow chart describing the storage of a mask within the mask storage device to prevent defect formation on a mask surface. A mask is provided 1102 by the operator or user. A mask storage device having at least a gasket and a desiccant is provided, and the mask storage device is opened 1104. The mask is then placed within the mask storage device 1106 and the mask storage device is sealed 1108. Upon sealing, an electrostatic preventive environment is created 1110 within the mask storage device. Further, ambient humidity is reduced 1112 within the mask storage device.

In the event a user requires use of the mask contained within the mask storage device, the user opens the mask storage device 1114, removes the mask 1116, and uses the mask in the lithography 1118. After lithography is complete, a user may then perform the steps to store the mask within the mask storage device. The storage of a mask includes temporary and permanent storage for purposes of maintaining the mask during periods of nonuse or processing of masks, regardless of whether lithography is performed before or after storage of the mask within the mask storage device 100, such as during shipping of masks.

Additionally, the mask storage device may be placed within a mask storage container 1120. The mask storage container is then sealed, an electrostatic preventive environment is created within the mask storage container and humidity is removed from the mask storage container 1122. Should a user require to use a mask, the mask storage container is opened 1124, a mask storage device removed 1126, and the mask storage device is opened 1114.

Figure 12:
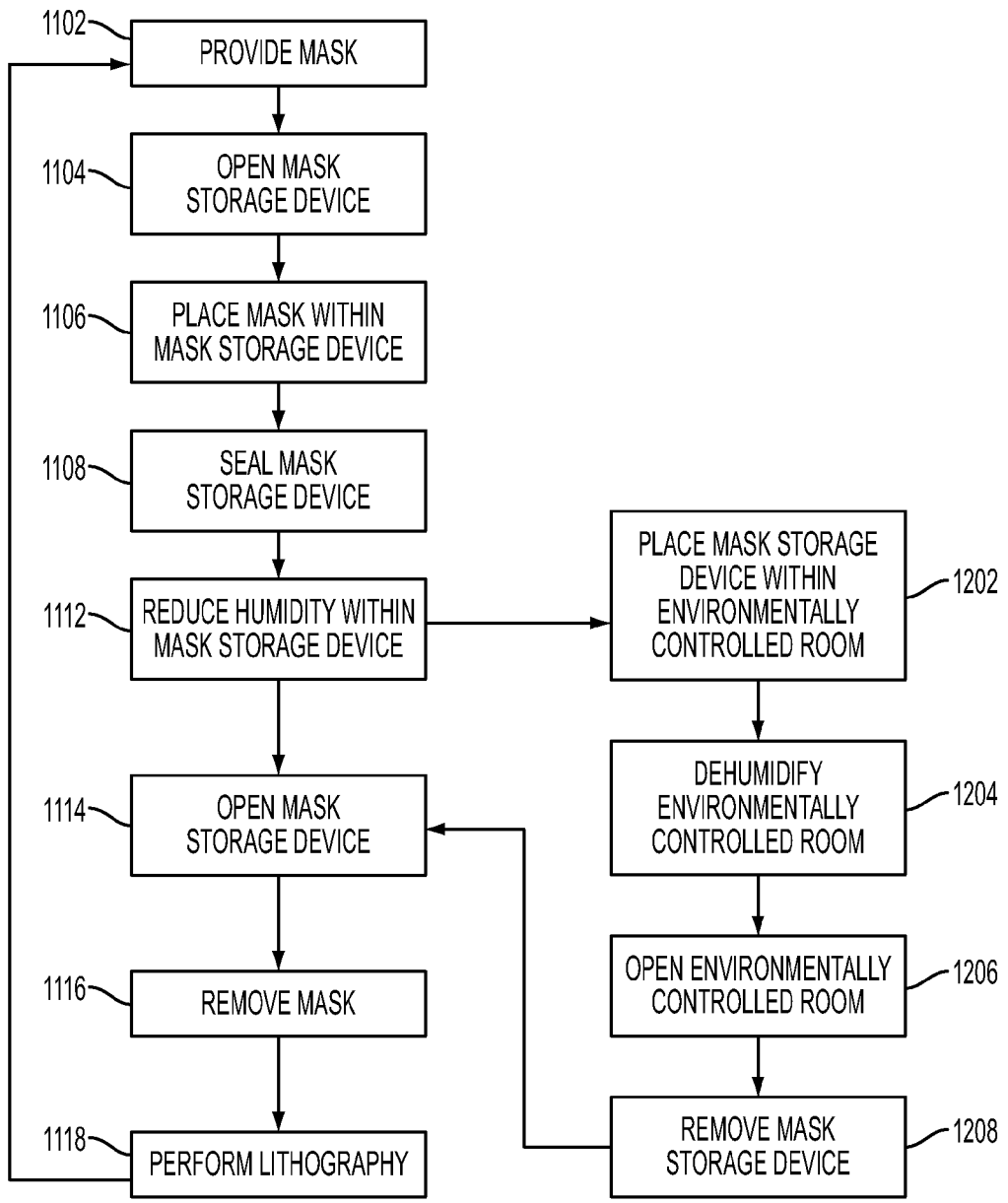
FIG. 12 is a flow chart of a method of use of the mask storage device in accordance with an embodiment.

FIG. 12 is a flow chart describing the storage of a mask within the mask storage device and environment controlled room. In some embodiments, mask storage device 100 is placed within an environment controlled room 1202. The room is humidity controlled by a dehumidifying system that filters and/or removes moisture from the air within the room 1204. The room is sealable and the dehumidifying system is controlled by a processor. Should a user require to use a mask, the environment controlled room is opened 1206, a mask storage device removed 1208, and the mask storage device is opened 1114.

Provided is a method of preventing defect formation on a mask surface used in lithography. The method includes providing a mask storage device comprising an upper and lower shell configured to form a sealed space in a closed state and a desiccant positioned within the mask storage device. A mask is placed inside the mask storage device. The mask is then sealed inside the mask storage device. In at least some embodiments, the mask is used in lithography before or after placement in and sealing of the mask storage device.

Further provided is a mask storage device for storing a mask used in lithography. The mask storage device has a lower shell containing a desiccant container. The desiccant container has a desiccant placed therein. The mask storage device has an upper shell removably attached to the lower shell and arranged to form a sealed space with the lower shell in a closed state. The mask storage device also has a gasket positioned between the lower shell and the upper shell, which is configured to create a sufficiently airtight seal between the lower shell and the upper shell in the closed state.

Still further provided is a method of preventing defect formation on a mask used in lithography. The method includes providing a mask storage device having a lower shell having a desiccant container, the desiccant container comprising a desiccant. Further, the mask storage device has an upper shell removably attached to the lower shell, and a gasket configured to contact the lower shell and upper shell to create a sufficiently airtight seal between the lower shell and upper shell. The method further includes placing a mask inside the mask storage device; and sealing the mask inside the mask storage device.

In the preceding detailed description, exemplary embodiments have been described. It will, however, be evident that various modifications, structures, processes, and changes may be made thereto without departing from the broader spirit and scope of the claims. The specification and drawings are, accordingly, to be regarded as illustrative and not restrictive. It is understood that the disclosure is capable of using various other combinations and environments and is capable of changes or modifications within the scope of the concept as expressed herein.

What is claimed is:

1. A method of preventing defect formation on a mask used in lithography, the method comprising:
    providing a mask storage device comprising a first shell and a second shell configured to form a sealed space in a closed state;
    placing a desiccant into a desiccant retainer configured to be positioned within the sealed space of the mask storage device, the desiccant retainer comprising one or more passages configured to allow moisture from outside the desiccant retainer to be absorbed by the desiccant;
    placing a mask inside the mask storage device; and
    sealing the mask storage device with the mask and desiccant inside the sealed space,
    wherein the one or more passages of the desiccant retainer comprise one or more membranes.

2. The method of claim 1, further comprising:
    unsealing the mask storage device;
    removing the mask from the mask storage device; and
    performing a semiconductor lithography process on the mask.

3. The method of claim 1, further comprising placing a plurality of mask storage devices within a mask storage container or a humidity controlled room.

4. The method of claim 1, further comprising providing a gasket between the first shell and the second shell, mating the gasket to the first shell, and mating the gasket to the second shell.

5. The method of claim 1, wherein the one or more passages of the desiccant retainer comprise one or more vents.

6. A method of preventing defect formation on a mask used in lithography, the method comprising:
    providing a mask storage device comprising:
        a first shell comprising a desiccant retainer, the desiccant retainer comprising one or more passages configured to allow moisture from outside the desiccant retainer to be absorbed by a desiccant placed within the desiccant retainer,
        a second shell removably attached to the first shell, the first shell and the second shell being closable to form a sealed space, the sealed space being configured to accommodate one or more masks with the desiccant retainer being positioned within the sealed space, and
        a gasket configured to contact the first shell and the second shell to create a sufficiently airtight seal between the first and second shell; and
    placing a mask inside the sealed space of the mask storage device; and
    sealing the mask inside the mask storage device,
    wherein the one or more passages of the desiccant retainer comprise one or more membranes.

7. The method of claim 6, further comprising placing the mask storage device in a humidity controlled room.

8. The method of claim 6, wherein the desiccant is selected from the group consisting of clay, calcium oxide, silica gel and a molecular sieve.

9. The method of claim 6, wherein the first shell and the second shell are constructed of an anti-electrostatic discharge material.

10. The method of claim 6, wherein the first shell further comprises a mating surface and the gasket is affixed to the mating surface.

11. The method of claim 6, wherein the second shell further comprises a mating surface and the gasket is affixed to the mating surface.

12. The method of claim 6, further comprising a latch or clamp to retain the mask storage device in a closed state.

13. A method of preventing defect formation on a mask used in lithography, the method comprising:
    placing a mask inside a mask storage, the mask storage device comprising:
        a first shell comprising a desiccant retainer, the desiccant retainer comprising one or more passages configured to allow moisture from outside the desiccant retainer to be absorbed by a desiccant placed within the desiccant retainer,
        a second shell removably attached to the first shell, the first shell and the second shell being closable to form a sealed space, the sealed space being configured to accommodate one or more masks with the desiccant retainer being positioned within the sealed space, and a gasket configured to contact the first shell and the second shell to create a sufficiently airtight seal between the first and second shell; and sealing the mask inside the mask storage device;

unsealing the mask storage device;

removing the mask from the mask storage device; and performing a semiconductor lithography process on the mask, wherein the one or more passages of the desiccant retainer comprise one or more membranes.

14. The method of claim 13, further comprising placing the mask storage device in a humidity controlled room.

15. The method of claim 13, wherein the desiccant is selected from the group consisting of clay, calcium oxide, silica gel and a molecular sieve.

16. The method of claim 13, wherein the first shell and the second shell are constructed of an anti-electrostatic discharge material.

17. The method of claim 13, wherein the first shell further comprises a mating surface and the gasket is affixed to the mating surface.

18. The method of claim 13, wherein the second shell further comprises a mating surface and the gasket is affixed to the mating surface.

19. The method of claim 13, further comprising a latch or clamp to retain the mask storage device in a closed state.

* * * * *